US008508125B2

(12) United States Patent
Stryakhilev et al.

(10) Patent No.: US 8,508,125 B2
(45) Date of Patent: Aug. 13, 2013

(54) ORGANIC LIGHT EMITTING DISPLAY APPARATUS

(75) Inventors: Denis Stryakhilev, Yongin (KR);
Tae-Woong Kim, Yongin (KR);
Jae-Seob Lee, Yongin (KR);
Young-Shin Pyo, Yongin (KR);
Dong-Un Jin, Yongin (KR); Dong-Beom Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 510 days.

(21) Appl. No.: 12/890,165

(22) Filed: Sep. 24, 2010

(65) Prior Publication Data

US 2011/0148745 A1   Jun. 23, 2011

(30) Foreign Application Priority Data

Dec. 22, 2009  (KR) .................. 10-2009-0129126

(51) Int. Cl.
*H01J 1/62* (2006.01)

(52) U.S. Cl.
USPC ........................................ 313/506; 313/504

(58) Field of Classification Search
USPC ........................................ 313/498, 504, 506
See application file for complete search history.

(56) References Cited

U.S. PATENT DOCUMENTS

2006/0220542 A1   10/2006   Suh et al.

FOREIGN PATENT DOCUMENTS

| KR | 10-0272255 | | 8/2000 |
|----|------------|---|--------|
| KR | 10-2004-0000629 | A | 1/2004 |
| KR | 10-2004-0037889 | A | 5/2004 |
| KR | 10-2006-0028251 | A | 3/2006 |
| KR | 10-2006-0104376 | A | 10/2006 |
| KR | 10-2007-0056626 | A | 6/2007 |
| KR | 10-2007-0068092 | A | 6/2007 |

OTHER PUBLICATIONS

Korean Office Action issued by the Korean Industrial Property Office in Korean Application No. 10-2009-0129126, dated Mar. 1, 2011, 4 pages.
P.I.Hsu, M. Huang, Z. Xi, S. Wagner, Z. Suo and J.C. Sturm, Spherical deformation of compliant substrates with semiconductor device island, Journal of Applied Physics, Jan. 15, 2004, 8 pages, vol. 95, No. 2, American Institute of Physics, Princeton, New Jersey.

*Primary Examiner* — Vip Patel (74) *Attorney, Agent, or Firm* — Knobbe, Martens, Olson & Bear LLP (57) ABSTRACT

Provided is an organic light emitting display apparatus including a substrate, a thin film transistor disposed on the substrate and including an active layer, a gate electrode, a gate insulator, a source electrode and a drain electrode, a first electrode electrically connected to the source electrode or the drain electrode, a second electrode disposed to face the first electrode, and an intermediate layer including an organic emitting layer and disposed between the first electrode and the second electrode. The gate insulator is disposed to insulate the gate electrode and the active layer and includes a plurality of patterns spaced apart from each other.

17 Claims, 5 Drawing Sheets

ORGANIC LIGHT EMITTING DISPLAY APPARATUS

CROSS-REFERENCE TO RELATED APPLICATIONS

This application claims the benefit of Korean Patent Application No. 10-2009-0129126, filed on Dec. 22, 2009, in the Korean Intellectual Property Office, the disclosure of which is incorporated herein in its entirety by reference.

BACKGROUND

1. Field

The present invention relates to an organic light emitting display apparatus, and more particularly, to an organic light emitting display apparatus with improved flexibility.

2. Description of the Related Technology

Recently, use of portable thin flat display devices has increased considerably. From among flat display devices, self-emitting display apparatuses, such as organic and inorganic light emitting display apparatuses, have a wide viewing angle, excellent contrast, and fast response time. Accordingly, the organic and inorganic light emitting display apparatuses have drawn much attention as the new generation of display devices. Moreover, the organic light emitting display apparatus, which includes a light emitting layer formed of an organic material, has brightness, driving voltage, and response time characteristics superior to the inorganic light emitting display apparatus and can display various colors.

In the organic light emitting display apparatus, a cathode electrode and an anode electrode are connected to an organic emitting layer, and when a voltage is applied to the electrodes, visible rays are generated in the organic emitting layer.

Recently, much research has been conducted on flexible display devices, and organic light emitting display apparatuses have been highlighted in this regard.

However, the organic light emitting display apparatus includes a plurality of thin films, for example, insulating layers such as gate insulators, which decrease the flexibility of the organic light emitting display apparatus.

Also, inorganic insulating layers decrease the flexibility of the inorganic light emitting display apparatus even more.

Consequently, limitations exist in manufacturing flexible organic light emitting display apparatuses having the desired characteristics.

SUMMARY OF CERTAIN INVENTIVE ASPECTS

The present invention provides an organic light emitting display apparatus, which can easily improve flexibility.

According to an aspect of the present invention, there is provided an organic light emitting display apparatus, including: a substrate; a thin film transistor disposed on the substrate, and including an active layer, a gate electrode, a gate insulator, a source electrode, and a drain electrode; a first electrode electrically connected to the source electrode or the drain electrode; a second electrode disposed to face the first electrode; and an intermediate layer including an organic emitting layer disposed between the first electrode and the second electrode, wherein the gate insulator is disposed to insulate the gate electrode and the active layer and includes a plurality of patterns spaced apart from each other.

The organic light emitting display apparatus may further include a plurality of sub-pixels, wherein at least one of the patterns is disposed in each of the sub-pixels.

The gate insulator may be formed not to overlap with the intermediate layer with respect to a direction parallel to a thickness direction of the substrate.

The gate electrode may be disposed on the substrate, the gate insulator may be disposed on the gate electrode, the active layer may be disposed on the gate insulator, the source electrode and the drain electrode may be disposed on the active layer, and the organic light emitting display apparatus may further include an etch stopper disposed between the active layer and the source electrode and between the active layer and the drain electrode, wherein the etch stopper may be patterned to expose a certain portion of the active layer.

The etch stopper may be formed not to overlap with the intermediate layer with respect to a direction parallel to a thickness direction of the substrate.

An outer edge of the etch stopper may not deviate from a region of the gate insulator with respect to a thickness direction of the substrate.

A planarization layer formed of an insulating material and including a contact hole may be disposed at an upper portion of the thin film transistor, the first electrode is disposed on the planarization layer and may be connected to the source electrode or the drain electrode through the contact hole, a pixel definition layer including an opening may be disposed on the first electrode, and the intermediate layer may be electrically connected to the first electrode through the opening.

The gate insulator may be formed not to overlap with the opening with respect to a direction parallel to a thickness direction of the substrate.

The first electrode and the gate electrode may be formed in the same plane.

One of the source electrode and the drain electrode may be extended in one direction and is formed integrally with the first electrode.

The substrate may be formed of a flexible material.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF CERTAIN INVENTIVE EMBODIMENTS

The present invention will now be described more fully with reference to the accompanying drawings, in which exemplary embodiments of the invention are shown.

Figure 1:
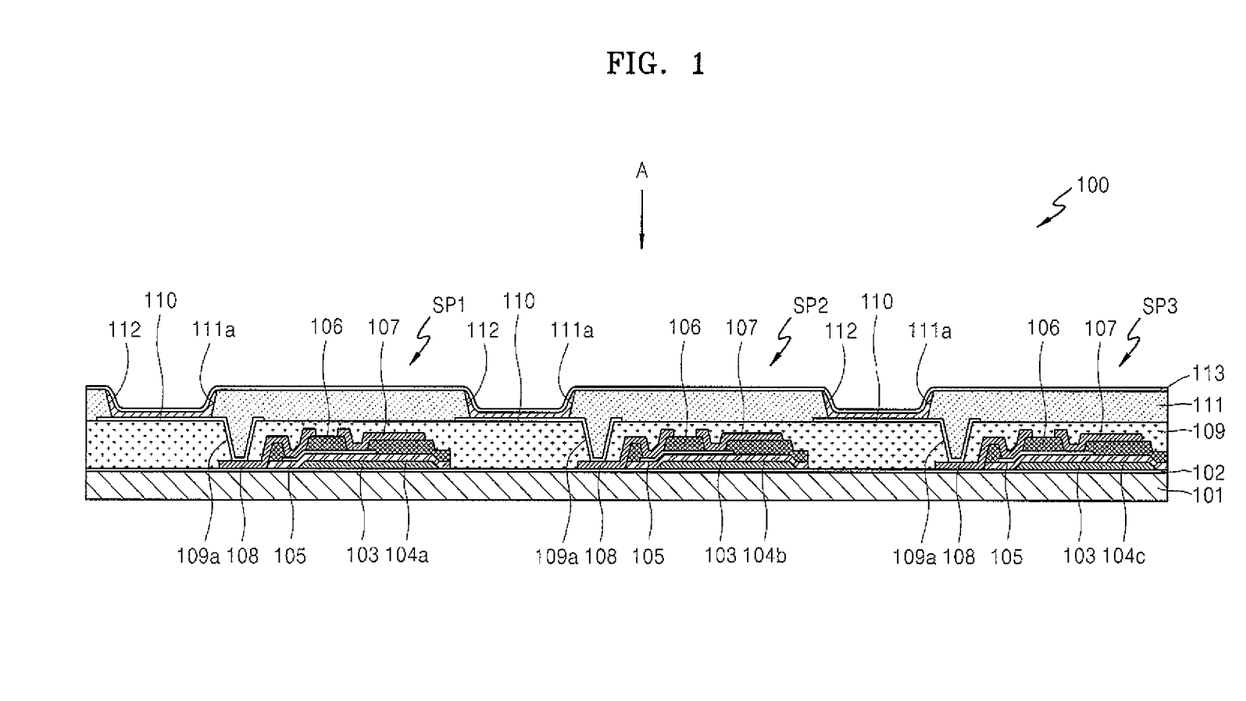
FIG. 1 is a cross-sectional view schematically illustrating an organic light emitting display apparatus according to an embodiment of the present invention.
Figure 2:
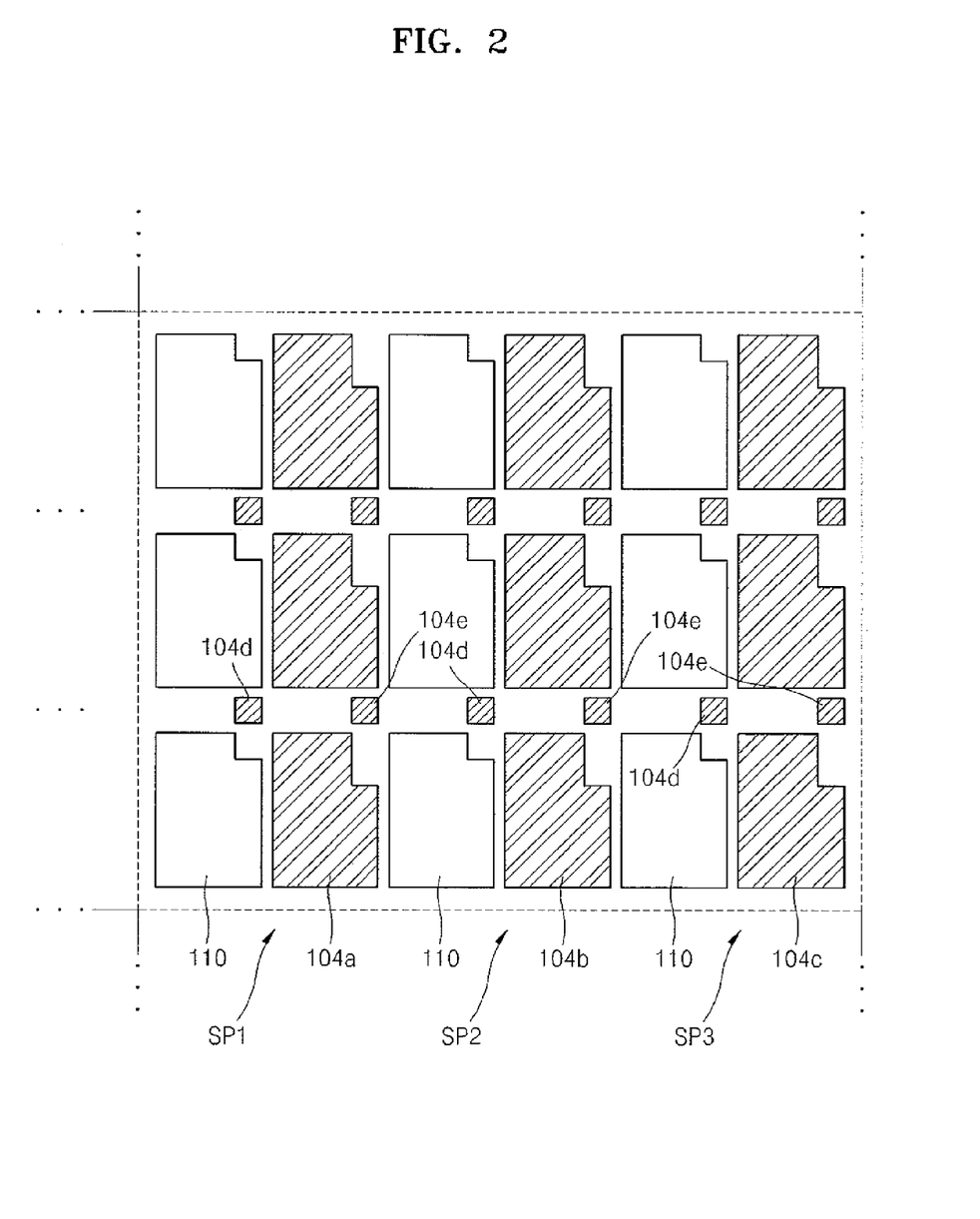
FIG. 2 is a plan view as seen from A of FIG. 1.

FIG. 1 is a cross-sectional view schematically illustrating an organic light emitting display apparatus 100 according to an embodiment of the present invention. FIG. 2 is a plan view as seen from A of FIG. 1.

The organic light emitting display apparatus 100 according to an embodiment of the present invention includes a substrate 101, a Thin Film Transistor (TFT), a first electrode 110, an intermediate layer 112 and a second electrode 113. Herein, a plurality of sub-pixels are disposed on the substrate 101. The TFT, the first electrode 110, the intermediate layer 112 including an organic emitting layer and the second electrode 113 are disposed at each of the sub-pixels.

The organic light emitting display apparatus 100 includes a plurality of sub-pixels. However, for convenience, only three sub-pixels are illustrated in FIG. 1. The three sub-pixels are respectively defined as a first sub-pixel SP1, a second sub-pixel SP2, and a third sub-pixel SP3 from the left to right.

A TFT is formed in each sub-pixel. In FIG. 1, one TFT is formed in each sub-pixel, but the present invention is not limited thereto. Thus, a plurality of TFTs may be included in each sub-pixel.

The TFT includes a gate electrode 103, a gate insulator 104, an active layer 105, a source electrode 107, and a drain electrode 108.

The configuration of each member will specifically be described below with reference to FIGS. 1 and 2. For convenience, FIG. 2 only illustrates the gate insulator 104 and the first electrode 110.

The substrate 101 may be formed of a flexible material such as a plastic material. The substrate 101 may include an organic material selected from the group consisting of polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose triacetate (TAC) and cellulose acetate propionate (CAP).

In the case of a rear emitting type where an image is implemented in the direction of the substrate 101, the substrate 101 is formed of a transparent material. In the case of a front emitting type where an image is implemented in the opposite direction of the substrate 101, the substrate 101 needs not necessarily be formed of a transparent material. In this case, the substrate 101 may be formed of a metal. When the substrate 101 is formed of a metal, the substrate 101 may include at least one metal selected from the group consisting of carbon (C), iron (Fe), chromium (Cr), manganese (Mn), nickel (Ni), titanium (Ti), molybdenum (Mo), stainless steel (SUS), invar alloy, inconel alloy and kovar alloy, but it is not limited thereto. The substrate 101 may be foamed of a metal foil.

A buffer layer 102 may be formed at the upper portion of the substrate 101 for forming a smooth surface at the upper portion of the substrate 101 and preventing impurities from penetrating into the upper portion of the substrate 101.

A gate electrode 103 of a certain pattern is formed on the buffer layer 102. The gate electrode 103 may be formed of a metal such as gold (Au), silver (Ag), copper (Cu), Ni, platinum (Pt), palladium (Pd), aluminum (Al) and Mo or a metal alloy such as Al:Nd alloy and Mo:W alloy, but the present invention is not limited thereto. Various materials may be used for forming the gate electrode 103 in consideration of adhesiveness to an adjacent layer, planarization, electric resistance, and processability. The gate electrode 103 is connected to a gate line (not shown) for applying a TFT on/off signal.

The gate insulator 104 is disposed on the gate electrode 103. The gate insulator 104 is for insulating the active layer 105 and the gate electrode 103, and may be formed on an organic material or an inorganic material such as SiNx or $SiO_2$.

At this point, the gate insulator 104 includes a plurality of patterns spaced apart from each other. That is, the gate insulator 104 is not formed in an integrally extended pattern.

The gate insulator 104 includes a first pattern 104a, a second pattern 104b, and a third pattern 104c. The first pattern 104a is disposed in the first sub-pixel SP1. The second pattern 104b is disposed in the second sub-pixel SP2. The third pattern 104c is disposed in the third sub-pixel SP3. The first to third patterns 104a to 104c are separated from each other.

The forms of the first to third patterns 104a to 104c are identical, but they are not limited thereto. That is, the forms of the first to third patterns 104a to 104c of the gate insulator 104 may be modified according to the form of a TFT included in the organic light emitting display apparatus 100. Each pattern of the first to third patterns 104a to 104c of the gate insulator 104 is formed in an appropriate form for insulating the gate electrode 103 and the active layer 105. At this point, the first to third patterns 104a to 104c of the gate insulator 104 may be formed to have a small size for insulating the gate electrode 103 and the active layer 105. Consequently, a separation space between the patterns of the gate insulator 104 is larger.

For convenience, the first to third patterns 104a to 104c are illustrated in FIG. 1. However, as illustrated in FIG. 2, the gate insulator 104 may include three or more patterns.

Moreover, the gate insulator 104 includes a fourth pattern 104d and a fifth pattern 104e, which are respectively disposed in a portion where the scan line (not shown) and data line (not shown) of the organic light emitting display apparatus 100 are overlapped and a portion where the scan line and power source line (not shown) of the organic light emitting display apparatus 100 are overlapped. The fourth pattern 104d and the fifth pattern 104e are formed to have a small size for insulating a portion where the scan line and the data line are overlapped and a portion where the scan line and the power source line are overlapped.

The active layer 105 is disposed on the gate insulator 104. The active layer 105 may be formed of an organic semiconductor or an inorganic semiconductor such as an amorphous silicon or a poly silicon, and includes a source region, a drain region, and a channel region.

The source and drain regions may be formed by doping impurities in the active layer 105 that is formed of an amorphous silicon or a poly silicon. A P-type semiconductor may be formed when doping with group-III boron (B), and an N-type semiconductor may be formed when doping with group-V nitrogen (N).

An etch stopper 106 is disposed between the active layer 105 and the source electrode 107 and between the active layer 105 and the drain electrode 108. The etch stopper 106 is formed of an insulating material and is patterned to expose a certain region of the active layer 105. The source electrode 107 and the drain electrode 108 are connected to the exposed portion of the active layer 105.

At this point, the outer edge of the etch stopper 106 does not deviate from the region of the gate insulator 104. That is, when seen from A of FIG. 1, the etch stopper 106 overlaps with the gate insulator 104.

The source electrode 107 and the drain electrode 108 may include Au, Pd, Pt, Ni, Rh, Ir, Os, Ti, Al or Mo. Moreover, the source electrode 107 and the drain electrode 108 may be formed of an alloy consisting of two or more kinds of metals, such as Al:Nd alloy or Mo:W alloy, but the present invention is not limited thereto.

A planarization layer 109 is disposed on the upper portion of the source electrode 107 and the upper portion of the drain electrode 108. The planarization layer 109 includes a contact hole 109a, and a certain region of the drain electrode 108 is exposed through the contact hole 109a. The planarization layer 109 may be formed of various insulating materials.

The first electrode 110 contacts the drain electrode 108 through the contact hole 109a. The first electrode 110 may be formed as a transparent electrode or a reflection electrode. When forming the first electrode 110 as a transparent electrode, the first electrode 110 may be formed of ITO, IZO, ZnO or $In_2O_3$. When forming the first electrode 110 as a reflection electrode, the reflection electrode is formed of at least one of Ag, Mg, Al, Pt, Pd, Au, Ni, Nd, Ir, Cr and the compound of these metals, and the first electrode 110 may be formed by forming a layer with ITO, IZO, ZnO or $In_2O_3$ on the reflection electrode.

A pixel definition layer 111 is formed on the first electrode 110. The pixel definition layer 111 is formed of an insulating material. The pixel definition layer 111 includes an opening 111a to expose the first electrode 110.

The intermediate layer 112 is formed in an opening 111a to contact the first electrode 110. The intermediate layer 112 includes an organic emitting layer, which emits light in response to the electrical driving of the first and second electrodes 110 and 113.

The intermediate layer 112 does not overlap with the gate insulator 104 in a lower portion. For this, the position of the first electrode 110 and the position of the opening 111a are controlled.

The intermediate layer 112 is formed of an organic material. When the organic emitting layer of the intermediate layer 112 is formed of a low molecular organic material, a Hole Transport Layer (HTL) and a Hole Injection Layer (HIL) are stacked with respect to the organic emitting layer in the direction of the first electrode 110. An Electron Transport Layer (ETL) and an Electron Injection Layer (EIL) are stacked in the direction of the second electrode 113. In addition, various layers may be stacked depending on the case. Examples of organic materials usable in the intermediate layer 112 may include copper phthalocyanine(CuPc), N'-Di(naphthalene-1-yl)-N, N'-diphenyl-benzidine: NPB, and tris-8-hydroxyquinoline aluminum (Alq3).

When the organic emitting layer of the intermediate layer 112 is formed of a polymer organic material, only an HTL may be included with respect to an organic emitting layer in the direction of the first electrode 110. A polymer hole transport layer is formed at the upper portion of a pixel electrode 212 through an inkjet printing process or a spin coating process by using poly-(2,4)-ethylene-dihydroxy thiophene (PEDOT) or polyaniline (PANT). The polymer organic emitting layer may use PPV, soluble PPV's, cyano-PPV and polyfluorene. A color pattern may be formed in an inkjet printing process, a spin coating process, or a thermal transfer process using laser.

At this point, the intermediate layers 112 that are respectively included in the first to third sub-pixels SP1 to SP3 may include an organic emitting layer emitting different visible rays.

The second electrode 113 is formed on the intermediate layer 112. The second electrode 113 may be formed by depositing a metal, i.e., Ag, Mg, Al, Pt, Pd, Au, Ni, Nd, Ir, Cr, Li, Ca and compound of these metals which have a low work function and depositing a transparent conductive material such as ITO, IZO, ZnO or $In_2O_3$ thereon.

In the present embodiment, the first electrode 110 is an anode, and the second electrode 113 is a cathode. However, the polarities of the first electrode 110 and the second electrode 113 may be switched.

A sealing member (not shown) may be disposed on the second electrode 113. The sealing member (not shown) is formed of a transparent material for protecting the intermediate layer 112 and other layers against external water or oxygen. For this, the sealing member may have a structure in which a glass, a plastic, or an organic material or an inorganic material are overlapped in a plurality of layers.

The gate insulator 104 of the organic light emitting display apparatus 100 is formed to have patterns spaced apart from each other. That is, the gate insulator 104 is not integrally formed.

The gate insulator 104 is formed of an inorganic material. Since such an inorganic layer has low flexibility, it may be difficult to improve the flexibility of the organic light emitting display apparatus 100. In the present embodiment, however, by making the patterns of the gate insulator 104, the flexibility of the organic light emitting display apparatus 100 can be improved.

Moreover, separation space between the patterns buffer an outside pressure, and consequently, the flexibility of the organic light emitting display apparatus 100 can be improved.

The pattern of the gate insulator 104 is formed not to overlap with the intermediate layer 112 emitting visible rays. Accordingly, with regard to the region of the organic light emitting display apparatus 100, particularly, the flexibility of a portion corresponding to the intermediate layer 112 can be improved. Thus, the organic light emitting display apparatus 100 can be applied to various fields.

The organic light emitting display apparatus 100 includes the etch stopper 106. The outer edge of the etch stopper 106 does not deviate from the region of the gate insulator 104. When forming the etch stopper 106 of an inorganic material, the etch stopper 106 affects the flexibility of the organic light emitting display apparatus 100. In the present embodiment, however, the outer edge of the etch stopper 106 does not deviate from the region of the gate insulator 104 when patterning the etch stopper 106. Accordingly, the flexibility of the organic light emitting display apparatus 100 can be improved by the form of the gate insulator 104.

Figure 3:
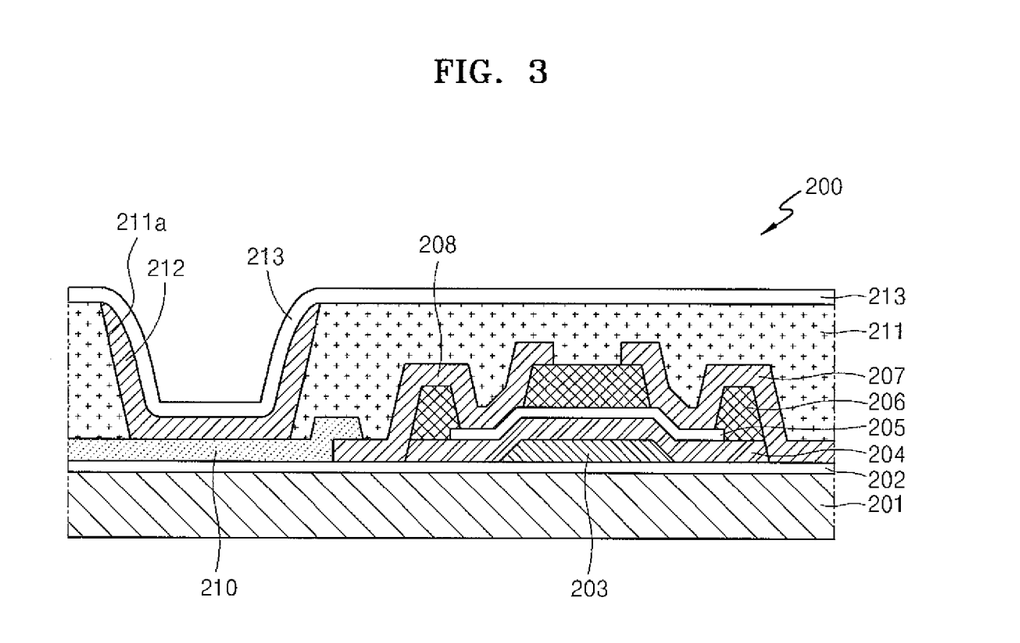
FIG. 3 is a cross-sectional view schematically illustrating an organic light emitting display apparatus according to another embodiment of the present invention.

FIG. 3 is a cross-sectional view schematically illustrating an organic light emitting display apparatus 200 according to another embodiment of the present invention. For convenience, the following description will present contents different from the above-described embodiment.

In FIG. 3, only one sub-pixel is illustrated. However, as in the above-described embodiment of FIG. 1, a plurality of sub-pixels are included in the organic light emitting display apparatus.

The organic light emitting display apparatus 200 includes a substrate 201, a TFT, a first electrode 210, an intermediate layer 212, and a second electrode 213.

The TFT includes a gate electrode 203, a gate insulator 204, an active layer 205, a source electrode 207, and a drain electrode 208.

Specifically, a buffer layer 202 is disposed at the upper portion of the substrate 201. The gate electrode 203 has a certain pattern and is formed on the buffer layer 202. The gate insulator 204 is disposed on the gate electrode 203. The gate insulator 204 includes a plurality of patterns spaced apart from each other. That is, the gate insulator 204 is not formed in integrally extended type.

Although not shown, the gate insulator 204 includes patterns spaced apart from each other in each sub-pixel.

The active layer 205 is disposed on the gate insulator 204, and an etch stopper 206 is disposed on the active layer 205. The source electrode 207 and the drain electrode 208 are connected to the active layer 205. The outer edge of the etch stopper 206 does not deviate from the region of the gate insulator 204.

The first electrode 210 is connected to the source electrode 207 and the drain electrode 208, and the first electrode 210 is formed on the buffer layer 202. That is, the first electrode 210 and the gate electrode 203 are disposed in the same plane.

A pixel definition layer 211 is formed on the first electrode 210, the source electrode 207 and the drain electrode 208. The pixel definition layer 211 includes an opening 211a to expose the first electrode 210.

The intermediate layer 212 is formed in the opening 211a to contact the first electrode 210. The inter mediate layer 212 includes an organic emitting layer (not shown).

The intermediate layer 212 does not overlap with the gate insulator 204 in a lower portion. For this, the position of the first electrode 210 and the position of the opening 211a are controlled.

The second electrode 213 is formed on the intermediate layer 212. A sealing member (not shown) may be disposed on the second electrode 213.

The gate insulator 204 of the organic light emitting display apparatus 200 is formed to have a plurality of patterns spaced apart from each other. The pattern of the gate insulator 204 is formed not to overlap with the intermediate layer 212 emitting visible rays, thereby improving the flexibility of the organic light emitting display apparatus 200. The outer edge of the etch stopper 206 does not deviate from the region of the gate insulator 204, and thus the flexibility of the organic light emitting display apparatus 200 can be improved.

In the organic light emitting display apparatus 200, moreover, the first electrode 210 is disposed on the buffer layer 202, like the gate electrode 203. That is, in the organic light emitting display apparatus 200, the thickness of a insulating layer corresponding to a planarization layer is reduced. By decreasing an insulating layer that is used, the flexibility of the organic light emitting display apparatus 200 can increase more, and a flexible display device may be easily implemented.

Figure 4:
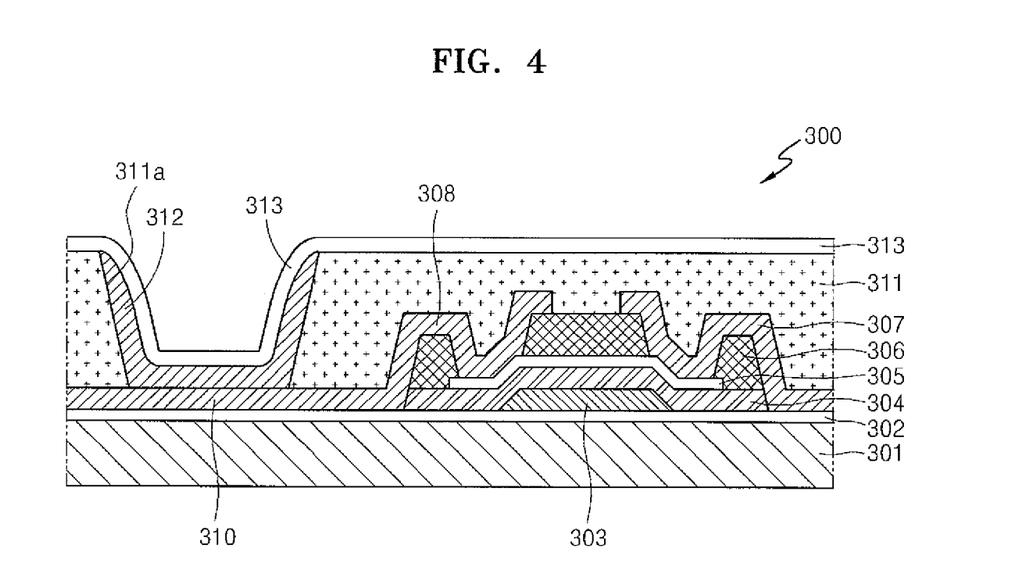
FIG. 4 is a cross-sectional view schematically illustrating an organic light emitting display apparatus according to another embodiment of the present invention.

FIG. 4 is a cross-sectional view schematically illustrating an organic light emitting display apparatus 300 according to another embodiment of the present invention. For convenience, the following description will present contents different from the above-described embodiment.

In FIG. 4, only one sub-pixel is illustrated. However, this is for convenience, and like in the above-described embodiment of FIG. 1, a plurality of sub-pixels are included in the organic light emitting display apparatus 300.

The organic light emitting display apparatus 300 includes a substrate 301, a TFT, a first electrode 310, an intermediate layer 312, and a second electrode 313.

The TFT includes a gate electrode 303, a gate insulator 304, an active layer 305, a source electrode 307, and a drain electrode 308.

Specifically, a buffer layer 302 is disposed at the upper portion of the substrate 301. The gate electrode 303 of a certain pattern is formed on the buffer layer 302. The gate insulator 304 is disposed on the gate electrode 303. The gate insulator 304 includes a plurality of patterns spaced apart from each other. That is, the gate insulator 304 is not formed in integrally extended type. Although not shown, as illustrated in FIGS. 1 and 2, the gate insulator 304 includes patterns that are separated for each sub-pixel and spaced apart from each other in each sub-pixel. The active layer 305 is disposed on the gate insulator 304, and an etch stopper 306 is disposed on the active layer 305. The source electrode 307 and the drain electrode 308 are connected to the active layer 305. The outer edge of the etch stopper 306 does not deviate from the region of the gate insulator 304.

The first electrode 310 is integrally formed to be connected to one of the source electrode 307 and the drain electrode 308. In FIG. 4, the drain electrode 308 is formed to long be extended. The drain electrode 308 is long extended and thereby the one end of the drain electrode 308 becomes the first electrode 310, wherein the first electrode 310 is formed on the buffer layer 302. That is, the first electrode 310 and the gate electrode 303 are disposed in the same plane.

A pixel definition layer 311 is formed on the first electrode 310, the source electrode 307, and the drain electrode 308. The pixel definition layer 311 includes an opening 311a to expose the first electrode 310.

The intermediate layer 312 is formed in the opening 311a to contact the first electrode 310. The intermediate layer 312 includes an organic emitting layer (not shown).

The intermediate layer 312 does not overlap with the gate insulator 304 in a lower portion. For this, the position of the first electrode 310 and the position of the opening 311a are controlled.

The second electrode 313 is formed on the intermediate layer 312. A sealing member (not shown) may be disposed on the second electrode 313.

The gate insulator 304 of the organic light emitting display apparatus 300 is formed to have a plurality of patterns spaced apart from each other. The pattern of the gate insulator 304 is formed not to overlap with the intermediate layer 312 emitting visible rays, thereby improving the flexibility of the organic light emitting display apparatus 300. The outer edge of the etch stopper 306 does not deviate from the region of the gate insulator 304, and thus the flexibility of the organic light emitting display apparatus 300 can be improved.

In the organic light emitting display apparatus 300, moreover, the first electrode 310 and the drain electrode 308 are integrally formed, and the first electrode 310 is disposed on the buffer layer 302 like the gate electrode 303. That is, in the organic light emitting display apparatus 300, the thickness of an insulating layer corresponding to a planarization layer is reduced. Accordingly, the flexibility of the organic light emitting display apparatus 300 can be increased more, and a flexible display device can easily be implemented.

Moreover, since the first electrode 310, the source electrode 307 and the drain electrode 308 may simultaneously be formed, the efficiency of a process is improved.

Figure 5:
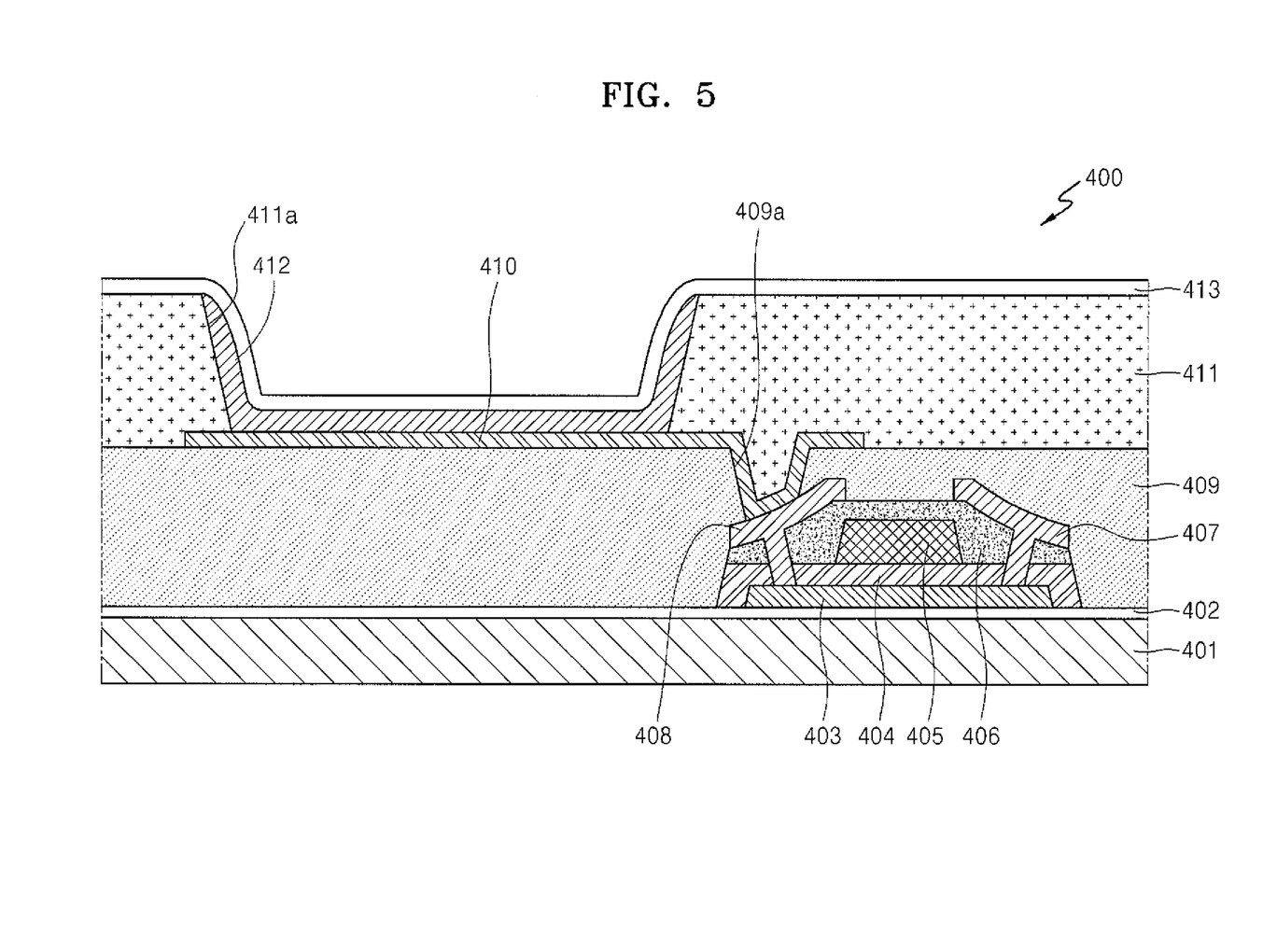
FIG. 5 is a cross-sectional view schematically illustrating an organic light emitting display apparatus according to another embodiment of the present invention.

FIG. 5 is a cross-sectional view schematically illustrating an organic light emitting display apparatus 400 according to another embodiment of the present invention. For convenience, the following description will present contents different from the above-described embodiment.

In FIG. 5, only one sub-pixel is illustrated. However, this is for convenience, like in the above-described embodiment of FIG. 1, a plurality of sub-pixels are included in the organic light emitting display apparatus 400.

The organic light emitting display apparatus 400 according to another embodiment of the present invention includes a substrate 401, a TFT, a first electrode 410, an intermediate layer 412, and a second electrode 413.

The TFT includes an active layer 403, a gate insulator 404, a gate electrode 405, a source electrode 407, and a drain electrode 408.

Specifically, a buffer layer 402 is disposed at the upper portion of the substrate 401. The active layer 403 of a certain pattern is formed on the buffer layer 402. The gate insulator 404 is disposed on the active layer 403. The gate insulator 404 includes a plurality of patterns spaced apart from each other. That is, the gate insulator 404 is not formed in integrally extended type.

Although not shown, as illustrated in FIGS. 1 and 2, the gate insulator 404 includes patterns that are separated for each sub-pixel and spaced apart from each other in each sub-pixel.

The gate electrode 405 is disposed on the gate insulator 404, and an interlayer dielectric 406 is disposed on the gate electrode 405. The interlayer dielectric 406 is formed of an insulating material to insulate the gate electrode 405, the source electrode 407, and the drain electrode 408. The interlayer dielectric 406 is formed to expose a certain region of the active layer 403. The source electrode 407 and the drain electrode 408 are connected to the exposed region of the active layer 406.

The outer edge of the interlayer dielectric 406 does not deviate from the region of the gate insulator 404. That is, the interlayer dielectric 406 is formed to overlap with the gate insulator 404 with respect to a thickness direction of the substrate 401 of FIG. 5.

A planarization layer 409 is disposed at the upper portion of the source electrode 407 and the upper portion of the drain electrode 408. The planarization layer 409 includes a contact hole 409a, and a certain region of the drain electrode 408 is exposed through the contact hole 409a.

The first electrode 410 is connected to the drain electrode 408. A pixel definition layer 411 is formed on the first electrode 410. The pixel definition layer 411 includes an opening 411a to expose the first electrode 410.

The intermediate layer 412 is formed in the opening 411a to contact the first electrode 410. The intermediate layer 412 includes an organic emitting layer (not shown).

The intermediate layer 412 does not overlap with the gate insulator 404 in a lower portion. For this, the position of the first electrode 410 and the position of the opening 411a are controlled.

The second electrode 413 is formed on the intermediate layer 412. A sealing member (not shown) may be disposed on the second electrode 413.

The gate insulator 404 of the organic light emitting display apparatus 400 is formed to have a plurality of patterns spaced apart from each other. The pattern of the gate insulator 404 is formed not to overlap with the intermediate layer 412 emitting visible rays, thereby improving the flexibility of the organic light emitting display apparatus 400. The outer edge of the interlayer dielectric 406 does not deviate from the region of the gate insulator 404, and thus the flexibility of the organic light emitting display apparatus 400 can be improved.

Figure 6:
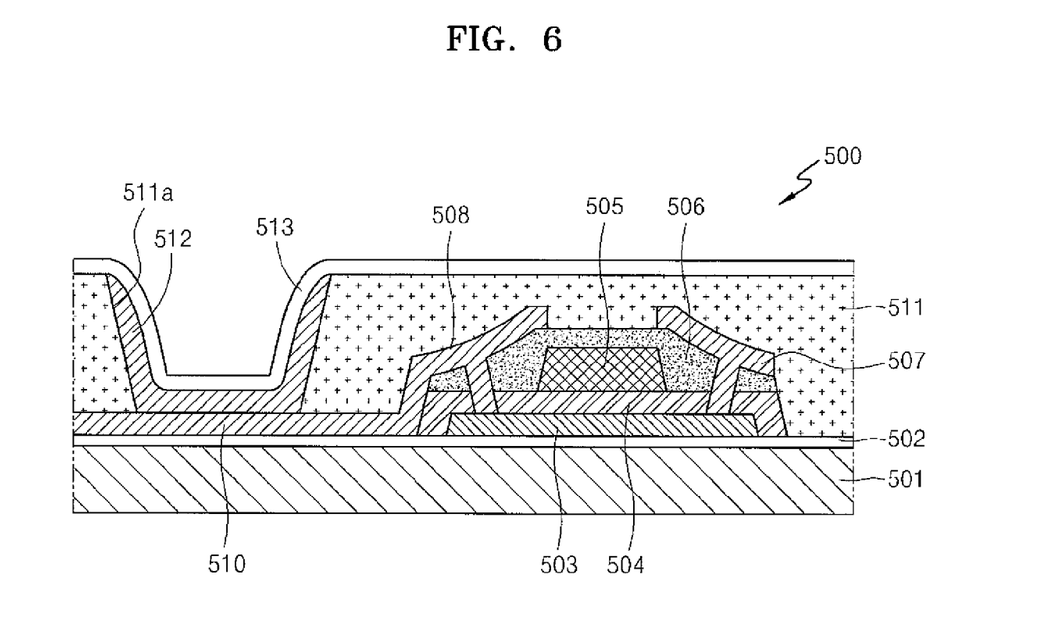
FIG. 6 is a cross-sectional view schematically illustrating an organic light emitting display apparatus according to another embodiment of the present invention.

FIG. 6 is a cross-sectional view schematically illustrating an organic light emitting display apparatus 500 according to another embodiment of the present invention. For convenience, the following description presents contents different from the above-described embodiment.

In FIG. 6, only one sub-pixel is illustrated. However, this is for convenience, and like in the above-described embodiment of FIG. 1, a plurality of sub-pixels are included in the organic light emitting display apparatus 500.

The organic light emitting display apparatus 500 includes a substrate 501, a TFT, a first electrode 510, an intermediate layer 512, and a second electrode 513.

The TFT includes an active layer 503, a gate insulator 504, a gate electrode 505, a source electrode 507, and a drain electrode 508.

Specifically, a buffer layer 502 is disposed at the upper portion of the substrate 501. The active layer 503 of a certain pattern is formed on the buffer layer 502. The gate insulator 504 is disposed on the active layer 503. The gate insulator 504 includes a plurality of patterns spaced apart from each other. That is, the gate insulator 504 is not formed in integrally extended type. Although not shown, as illustrated in FIGS. 1 and 2, the gate insulator 504 includes patterns that are separated for each sub-pixel and spaced apart from each other in each sub-pixel.

The gate electrode 505 is disposed on the gate insulator 504, and an interlayer dielectric 506 is disposed on the gate electrode 505. The interlayer dielectric 506 is formed of an insulating material to insulate the gate electrode 505, the source electrode 507 and the drain electrode 508. The interlayer dielectric 506 is formed to expose a certain region of the active layer 503. The source electrode 507 and the drain electrode 508 are connected to be connected to the exposed region of the active layer 506.

The outer edge of the interlayer dielectric 506 does not deviate from the region of the gate insulator 504.

The first electrode 510 is formed integrally with the source electrode 507 and the drain electrode 508. That is, the source electrode 507 or the drain electrode 508 is formed in a long extended type. In FIG. 6, the drain electrode 508 is formed to long be extended. As the drain electrode 508 is long extended, and thereby the one end of the drain electrode 508 becomes the first electrode 510, wherein the first electrode 510 is formed on the buffer layer 502. That is, the first electrode 510 and the active layer 503 are disposed on the same straight line.

A pixel definition layer 511 is formed on the first electrode 510, the source electrode 507, and the drain electrode 508. The pixel definition layer 511 includes an opening 511a to expose the first electrode 510.

The intermediate layer 512 is formed in the opening 511a to contact the first electrode 510. The intermediate layer 512 includes an organic emitting layer (not shown).

The intermediate layer 512 does not overlap with the gate insulator 504 in a lower upper. For this, the position of the first electrode 510 and the position of the opening 511a are controlled.

The second electrode 513 is formed on the intermediate layer 512. A sealing member (not shown) may be disposed on the second electrode 513.

The gate insulator 504 of the organic light emitting display apparatus 500 is formed to have a plurality of patterns spaced apart from each other. The pattern of the gate insulator 504 is formed not to overlap with the intermediate layer 512 emitting visible rays, thereby improving the flexibility of the organic light emitting display apparatus 500. The outer edge of the interlayer dielectric 506 does not deviate from the region of the gate insulator 504, and thus the flexibility of the organic light emitting display apparatus 500 can be improved.

In the organic light emitting display apparatus 500, moreover, the first electrode 510 and the drain electrode 508 are integrally formed, and the first electrode 510 is disposed on the buffer layer 502 like the active layer 503. That is, in the organic light emitting display apparatus 500, the thickness of an insulating layer corresponding to a planarization layer is reduced. Accordingly, the flexibility of the organic light emitting display apparatus 500 can increase more, and a flexible display device can easily be implemented.

Moreover, since the first electrode 510, the source electrode 507 and the drain electrode 508 may simultaneously be formed, the efficiency of a manufacturing process is improved.

Figure 7:
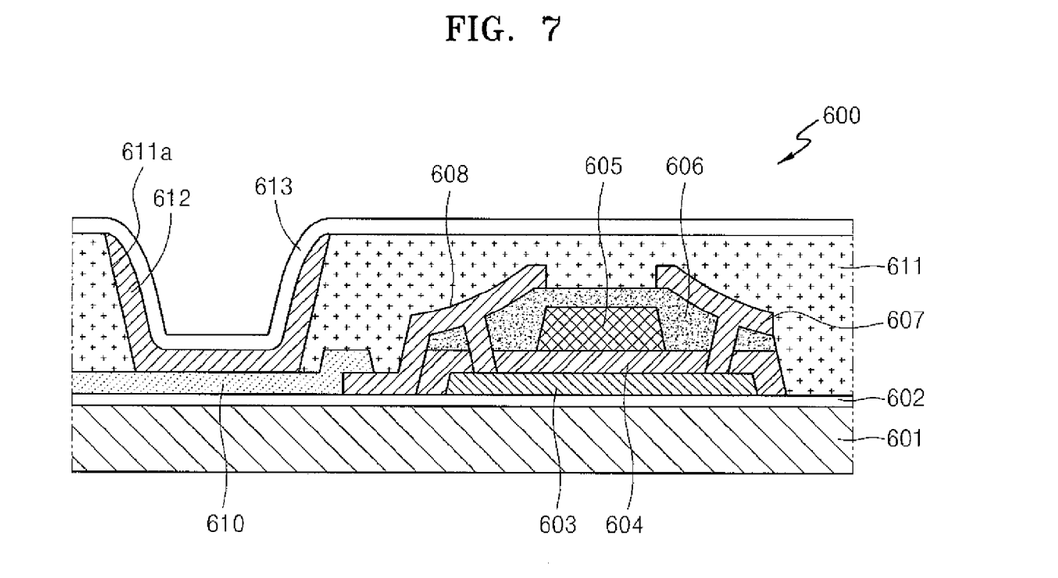
FIG. 7 is a cross-sectional view schematically illustrating an organic light emitting display apparatus according to another embodiment of the present invention.

FIG. 7 is a cross-sectional view schematically illustrating an organic light emitting display apparatus 600 according to another embodiment of the present invention. For convenience, the following description will present contents different from the above-described embodiment.

In FIG. 7, only one sub-pixel is illustrated. However, this is for convenience, and like in the above-described embodiment of FIG. 1, a plurality of sub-pixels are included in the light emitting display apparatus 600.

An organic light emitting display apparatus 600 includes a substrate 601, a TFT, a first electrode 610, an intermediate layer 612, and a second electrode 613.

The TFT includes an active layer 603, a gate insulator 604, a gate electrode 605, a source electrode 607, and a drain electrode 608.

Specifically, a buffer layer 602 is disposed at the upper portion of the substrate 601. The active layer 603 of a certain pattern is formed on the buffer layer 602. The gate insulator 604 is disposed on the active layer 603. The gate insulator 604 includes a plurality of patterns spaced apart from each other. That is, the gate insulator 604 is not formed in integrally extended type.

Although not shown, as illustrated in FIGS. 1 and 2, the gate insulator 504 includes patterns that are separated for each sub-pixel and spaced apart from each other in each sub-pixel.

The gate electrode 605 is disposed on the gate insulator 604, and an interlayer dielectric 606 is disposed on the gate electrode 605. The interlayer dielectric 606 is formed of an insulating material to insulate the gate electrode 605, the source electrode 607 and the drain electrode 608. The interlayer dielectric 606 is formed to expose a certain region of the active layer 603. The source electrode 607 and the drain electrode 608 are connected to the exposed region of the active layer 606.

The outer edge of the interlayer dielectric 606 does not deviate from the region of the gate insulator 604.

The first electrode 610 is formed integrally with the source electrode 607 and the drain electrode 608. The first electrode 610 is formed on the buffer layer 602. That is, the first electrode 610 and the active layer 603 are disposed in the same plane.

A pixel definition layer 611 is formed on the first electrode 610, the source electrode 607, and the drain electrode 608. The pixel definition layer 611 includes an opening 611a to expose the first electrode 610.

An intermediate layer 612 is formed in the opening 611a to contact the first electrode 610. The intermediate layer 612 includes an organic emitting layer (not shown).

The intermediate layer 612 does not overlap with the gate insulator 604 in a lower upper. For this, the position of the first electrode 610 and the position of the opening 611a are controlled.

The second electrode 613 is formed on the intermediate layer 612. A sealing member (not shown) may be disposed on the second electrode 613.

The gate insulator 604 of the organic light emitting display apparatus 600 is formed to have a plurality of patterns spaced apart from each other. The pattern of the gate insulator 604 is formed not to overlap with the intermediate layer 612 emitting visible rays, thereby improving the flexibility of the organic light emitting display apparatus 600. The outer edge of the interlayer dielectric 606 does not deviate from the region of the gate insulator 604, and thus the flexibility of the organic light emitting display apparatus 600 can be improved.

In the organic light emitting display apparatus 600, the first electrode 610 is disposed on the buffer layer 602 like the gate electrode 603. That is, in the organic light emitting display apparatus 600, the thickness of an insulating layer corresponding to a planarization layer is reduced. Accordingly, the flexibility of the organic light emitting display apparatus 600 can increase more, and a flexible display device can easily be implemented.

As a result, the flexibility of the organic light emitting display apparatus according to embodiments of the present invention can be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus, comprising:
   a substrate;
   a thin film transistor disposed on the substrate, and comprising an active layer, a gate electrode, a gate insulator, a source electrode, and a drain electrode;
   a first electrode electrically connected to the source electrode or the drain electrode;
   a second electrode disposed to face the first electrode; and
   an intermediate layer comprising an organic emitting layer disposed between the first electrode and the second electrode,
   wherein the gate insulator is disposed to insulate the gate electrode and the active layer and comprises a plurality of patterns spaced apart from each other.

2. The organic light emitting display apparatus of claim 1, further comprising a plurality of sub-pixels, wherein at least one of the patterns is disposed in each of the sub-pixels.

3. The organic light emitting display apparatus of claim 1, wherein the gate insulator is formed not to overlap with the intermediate layer with respect to a direction parallel to a thickness direction of the substrate.

4. The organic light emitting display apparatus of claim 1, wherein:
   the gate electrode is disposed on the substrate,
   the gate insulator is disposed on the gate electrode,
   the active layer is disposed on the gate insulator,
   the source electrode and the drain electrode are disposed on the active layer, and
   the organic light emitting display apparatus further comprises an etch stopper disposed between the active layer and the source electrode and between the active layer and the drain electrode, wherein the etch stopper is patterned to expose a certain portion of the active layer.

5. The organic light emitting display apparatus of claim 4, wherein the etch stopper is formed not to overlap with the intermediate layer with respect to a direction parallel to a thickness direction of the substrate.

6. The organic light emitting display apparatus of claim 4, wherein an outer edge of the etch stopper does not deviate from a region of the gate insulator with respect to a thickness direction of the substrate.

7. The organic light emitting display apparatus of claim 4, wherein:
   a planarization layer formed of an insulating material and comprising a contact hole is disposed at an upper portion of the thin film transistor,
   the first electrode is disposed on the planarization layer and is connected to the source electrode or the drain electrode through the contact hole,
   a pixel definition layer comprising an opening is disposed on the first electrode, and
   the intermediate layer is electrically connected to the first electrode through the opening.

8. The organic light emitting display apparatus of claim 7, wherein the gate insulator is formed not to overlap with the opening with respect to a direction parallel to a thickness direction of the substrate.

9. The organic light emitting display apparatus of claim 4, wherein the first electrode and the gate electrode are formed in the same plane.

10. The organic light emitting display apparatus of claim 1, wherein:
   the active layer is disposed on the substrate,
   the gate insulator is disposed on the active layer,
   the gate electrode is disposed on the gate insulator,
   the source electrode and the drain electrode are disposed on the gate electrode, and
   the organic light emitting display apparatus further comprises an interlayer dielectric disposed between the gate electrode and the source electrode and between the gate electrode and the drain electrode, wherein the interlayer dielectric is patterned to expose a certain portion of the active layer.

11. The organic light emitting display apparatus of claim 10, wherein the interlayer dielectric is formed not to overlap with the intermediate layer with respect to a direction parallel with a thickness direction of the substrate.

12. The organic light emitting display apparatus of claim 10, wherein an outer edge of the interlayer dielectric does not deviate from a region of the gate insulator with respect to a thickness direction of the substrate.

13. The organic light emitting display apparatus of claim 10, wherein:
   a planarization layer formed of an insulating material and comprising a contact hole is disposed at an upper portion of the thin film transistor,
   the first electrode is disposed on the planarization layer and connected to the source electrode or the drain electrode through the contact hole,
   a pixel definition layer comprising an opening is disposed on the first electrode, and
   the intermediate layer is electrically connected to the first electrode through the opening.

14. The organic light emitting display apparatus of claim 13, wherein the gate insulator is formed not to overlap with the opening with respect to a direction parallel to a thickness direction of the substrate.

15. The organic light emitting display apparatus of claim 10, wherein the first electrode and the active layer are formed in the same plane.

16. The organic light emitting display apparatus of claim 1, wherein one of the source electrode and the drain electrode is extended in one direction and is formed integrally with the first electrode.

17. The organic light emitting display apparatus of claim 1, wherein the substrate is formed of a flexible material.

\* \* \* \* \*